United States Patent
Higashi et al.

(10) Patent No.: US 7,463,541 B2
(45) Date of Patent: Dec. 9, 2008

(54) SEMICONDUCTOR STORAGE DEVICE

(75) Inventors: Tomoki Higashi, Kanagawa (JP); Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/099,647

(22) Filed: Apr. 8, 2008

(65) Prior Publication Data

US 2008/0205181 A1    Aug. 28, 2008

Related U.S. Application Data

(62) Division of application No. 11/062,624, filed on Feb. 23, 2005, now Pat. No. 7,411,850.

(30) Foreign Application Priority Data

Oct. 29, 2004 (JP) ............................. 2004-316043

(51) Int. Cl.
*G11C 7/02* (2006.01)
(52) U.S. Cl. .................... 365/210.1; 365/207
(58) Field of Classification Search .............. 365/210.1, 365/207
See application file for complete search history.

(56) References Cited

U.S. PATENT DOCUMENTS

| | | | |
|---|---|---|---|
| 6,256,247 B1 | 7/2001 | Perner | |
| 6,567,330 B2 | 5/2003 | Fujita et al. | |
| 6,621,725 B2 | 9/2003 | Ohsawa | |
| 6,707,701 B2 * | 3/2004 | Ashikaga | 365/145 |
| 6,822,907 B2 | 11/2004 | Maruyama et al. | |
| 6,898,137 B2 | 5/2005 | Arimoto et al. | |
| 7,088,629 B2 * | 8/2006 | Ohsawa | 365/205 |
| 2003/0156478 A1 * | 8/2003 | Maruyama et al. | 365/200 |
| 2005/0024940 A1 | 2/2005 | Kato | |
| 2005/0047234 A1 | 3/2005 | Kamata | |

* cited by examiner

*Primary Examiner*—Amir Zarabian
*Assistant Examiner*—Kretelia Graham
(74) *Attorney, Agent, or Firm*—Oblon, Spivak, McClelland, Maier & Neustadt, P.C.

(57) ABSTRACT

A semiconductor storage device comprises information memory cells into which data can be written or from which data can be read; a memory cell array including the information memory cells arranged in a matrix; information word lines connected to the information memory cells in rows of the memory cell array; information bit lines connected to the information memory cells in columns of the memory cell array; a reference memory cell storing a single kind of digital data to generate a reference potential used to discriminate data stored in the information memory cells; a reference bit line connected to the reference memory cell; and sense amplifiers connected to the information bit lines and the reference bit line.

3 Claims, 9 Drawing Sheets

BL0~BLn···INFORMATION BIT LINE
DMC0···REFERENCE MEMORY CELL
DBL0, DBL1···REFERENCE BIT LINE
SA1~SAn···SENSE AMPLIFIER
$T_{BS0}$~$T_{BSn}$···SELECTION TRANSISTOR
$T_{FAIT}$···CLAMP TRANSISTOR
$T_{CL0}$, $T_{CL1}$···LOAD CURRENT TRANSISTOR

100···SEMICONDUCTOR ATORAGE DEVICE
MC···INFORMATION MEMORY CELL
MCA···MEMORY CELL ARRAY
WL0~WLm···INFORMATION WORD LINE

SEMICONDUCTOR STORAGE DEVICE

CROSS-REFERENCE TO RELATED APPLICATIONS

This application is a divisional of U.S. application Ser. No. 11/062,624 filed Feb. 23, 2005, and is based upon and claims the benefit of priority from the prior Japanese Patent Applications No. 2004-316043, filed on Oct. 29, 2004, the entire contents of each of which are incorporated herein by reference.

BACKGROUND OF THE INVENTION

1. Field of the Invention

The present invention relates to a semiconductor storage device.

2. Background Art

The FBC (Floating Body Cell) is a volatile memory formed on a SOI substrate. It is a memory that stores data "1" or "0" depending upon whether holes are stored in a floating body of a transistor. In order to discriminate data "1" or "0" stored in a memory cell, a reference potential having a middle potential between data "1" and data "0" is generated. The reference potential is generated by short-circuiting a reference memory cell having data "1" stored therein and a reference memory cell having data "0" stored therein to each other. A sense amplifier compares a potential of data read out from a memory cell having certain information stored therein with the reference potential. As a result, it can be discriminated whether data stored in the memory cell is "1" or "0."

Thus for generating the reference potential, a reference memory cell having data "1" stored therein and a reference memory cell having data "0" stored therein are needed.

In general, in the case of data "1," holes are already stored in the floating body and consequently the FBC memory cell is not affected by retention. In the case of data "0," holes gradually get into the floating body because of retention and data changes to "1." Thus, in FBC memory cells, not only memory cells having information stored therein, but also reference memory cells having data "0" used as reference potential are also affected by the retention. In order to prevent the reference potential from being varied by the retention, therefore, refresh operation is needed. This results in a problem that reduction of power dissipation in the semiconductor apparatus is difficult.

If a reference potential is generated by using the memory cell having data "1" stored therein and the reference cell having data "0" stored therein, variation occurs in the reference potential. The variation in the reference potential is the average of the variation in the reference memory cell having data "1" stored therein and the variation in the reference memory cell having data "0" stored therein. If the variation in the reference potential is large, the range of the variation in the reference potential and the variation in the memory cell overlap each other in some cases. This affects the yield of the semiconductor storage device. Therefore, it is necessary to make the width of the potential difference between data "1" and data "0" large so as to prevent the variation range of the reference potential and the variation range of the memory cell from overlapping each other. In the situation where the semiconductor storage device is made finer and finer, it is difficult to make the width of the potential difference between data "1" and data "0."

Therefore, a semiconductor storage device including a reference memory cell, which generates a reference potential having less variation and which does not need refresh operation, is desired.

SUMMARY OF THE INVENTION

A semiconductor storage device according to an embodiment of the present invention comprises information memory cells; a memory cell array including the information memory cells arranged in a matrix; information word lines connected to the information memory cells in rows of the memory cell array; information bit lines connected to the information memory cells in columns of the memory cell array; a reference memory cell storing a single kind of digital data; a reference bit line connected to the reference memory cell; and sense amplifiers connected to the information bit lines and the reference bit line.

A semiconductor storage device according to another embodiment of the present invention comprises information memory cells; a plurality of memory cell arrays including the information memory cells arranged in a matrix; information word lines connected to the information memory cells in rows of the memory cell arrays; bit lines connected to the information memory cells in columns of the memory cell arrays; a reference memory cell provided for a pair of bit lines and storing a single kind of digital data; a reference bit line connected to the reference memory cell; and a sense amplifier connected to two bit lines, which are included respectively in two memory cell arrays adjacent to each other, the sense amplifier being connected to the information memory cell included in one of the two memory cell arrays via one of the two bit lines and being connected to the reference memory cell included in the other memory cell array via the other bit line.

A semiconductor storage device according to further embodiment of the present invention comprises information memory cells; memory cell arrays including the information memory cells arranged in a matrix; information word lines connected to the information memory cells in rows of the memory cell arrays; sub bit lines connected to the information memory cells in columns of the memory cell arrays; main bit lines connected to the sub bit lines; a select transistor connecting one of the sub bit lines to one of the main bit lines; reference memory cells provided for the sub bit lines and storing a single kind digital data; reference word lines connected to the reference memory cells; and a sense amplifier connected to two main bit lines, which are included respectively in two memory cell arrays adjacent to each other, the sense amplifier being connected to the information memory cell included in one of the two memory cell arrays via one of the two main bit lines and being connected to the reference memory cell included in other memory cell array via the other main bit line.

DETAILED DESCRIPTION OF THE INVENTION

Hereafter, embodiments according to the present invention will be described with reference to the drawings. The embodiments do not restrict the present invention. In the embodiments according to the present invention, the reference potential is generated by using digital data of a single kind, i.e. digital data "1". As a result, it is possible to prevent data in the reference memory cell from being degraded by retention and make variations in the reference potential small.

First Embodiment

Figure 1:
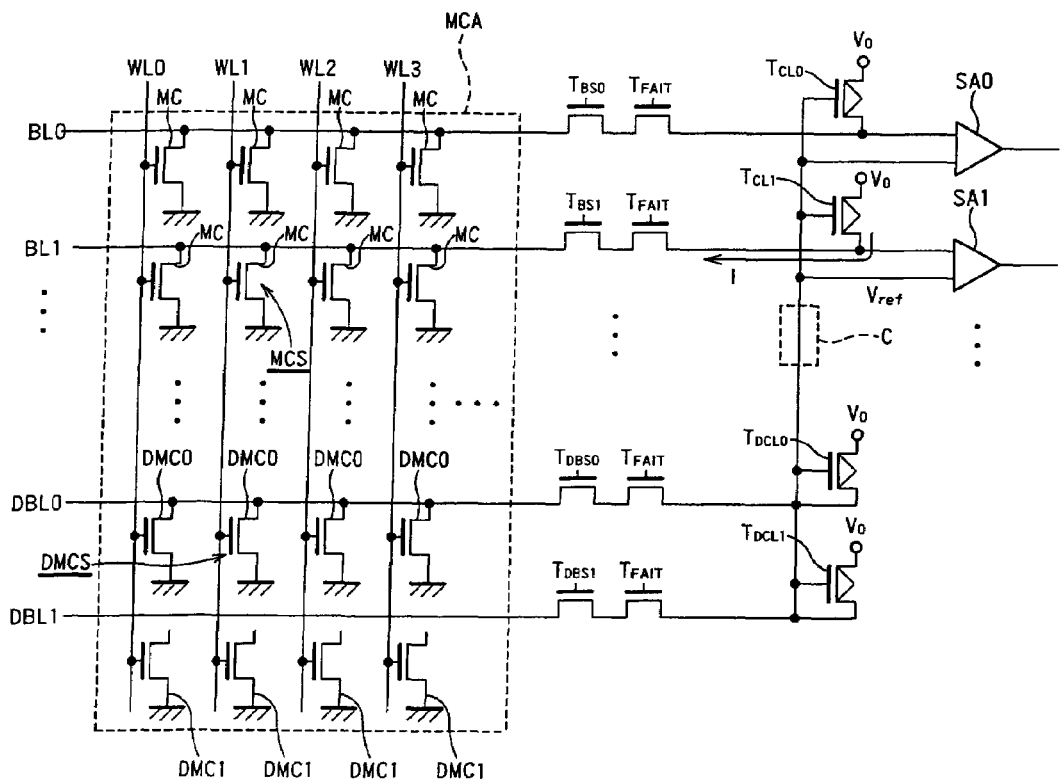
FIG. 1 is a partial circuit diagram of a semiconductor storage device 100 according to a first embodiment of the present invention.

FIG. 1 is a partial circuit diagram of a semiconductor storage device 100 according to a first embodiment of the present invention. The semiconductor storage device 100 includes information memory cells MC (hereafter also referred to simply as memory cells), information word lines (hereafter also referred to simply as word lines) WL0 to WLm, information bit lines (hereafter also referred to simply as bit lines) BL0 to BLn, reference memory cells DMC0, reference bit lines DBL0 and DBL1, sense amplifiers SA0 to SAn, selection transistors $T_{BS0}$ to $T_{BSn}$, clamp transistors $T_{FAIT}$, and load current transistors $T_{CL0}$ and $T_{CL1}$. Here, m and n are natural numbers.

A memory cell array MCA is an arrangement of the memory cells MC arranged in a matrix form. The memory cells MC are n-type FBC memory cells into/from which data can be written/read. In the present embodiment, data in a memory cell MC is data "1" in a state in which holes are stored in its floating body (not illustrated), whereas the data in the memory cell MC is data "0" in a state in which holes are not stored in its floating body. At this time, a threshold voltage Vt1 of a memory cell MC having data "1" stored therein becomes lower than a threshold voltage Vt0 of a memory cell MC having data "0" stored therein. A difference in current that flows through the memory cell MC caused by the difference between the threshold voltage Vt0 and Vt1 is converted to a voltage. A sense amplifier SA discriminates the data on the basis of the voltage difference. When reading out data, the memory cell MC is driven in a linear region by, for example, applying 1.5 V to a word line and applying 0.2 V to a bit line.

The word lines WL0 to WLm are respectively connected to gates of memory cells MC arranged in a row direction of the memory cell array MCA. The bit lines BL0 to BLn are respectively connected to gates of memory cells MC arranged in a column direction of the memory cell array MCA. By the way, in the present embodiment, the direction in which the word lines WL0 to WLm extend is defined as the row direction, whereas the direction in which the bit lines BL0 to BLn extend is defined as the column direction.

The sense amplifiers SA0 to SAn are disposed so as to be respectively associated with the bit lines BL0 to BLn, and sense data stored in the memory cells MC. The selection transistors $T_{BS0}$ to $T_{BSn}$ are connected between the bit lines BL0 to BLn and the sense amplifiers SA0 to SAn, respectively.

When reading out data stored in the memory cell MC, a voltage is applied to one of the word lines WL0 to WLm and one of the selection transistors $T_{BS0}$ to $T_{BSn}$ is turned on to connect associated one of the bit lines BL0 to BLn to a first input of an associated sense amplifier. For example, if the bit line WL1 and the bit line BL1 are selected, a memory cell MCS is selected. The memory cell MCS is connected to the sense amplifier SA1 by turning on the selection transistor $T_{BS1}$. In addition, a power supply V0 is connected to the memory cell MCS to let flow a current I through the memory cell MCS by turning on the load current transistor $T_{CL1}$. As a result, a potential depending on the data ("0" or "1") stored in the memory cell MCS is transmitted to a first input of the sense amplifier SA1.

It should be noted that a drive voltage Vg applied to a word line is a voltage that is at least the threshold voltage Vt1 of the memory cell having data "1" stored therein and that is at most the threshold voltage Vt0 of the memory cell having data "0" stored therein. In other words, the drive voltage Vg satisfies the following expression (1).

$$Vt1 \leq Vg \leq Vt0 \tag{1}$$

Since the threshold voltage Vg is at most the drive voltage Vt0, the memory cell MCS does not turn on when the data stored in the memory cell MCS is "0." Therefore, the potential on a bit line that carries data "0" becomes V0 which is equal to the power supply voltage. On the other hand, since the threshold voltage Vg is at least the drive voltage Vt1, the memory cell MCS turns on when the data stored in the memory cell MCS is "1." Therefore, the potential on a bit line that carries data "1" becomes V1 which is lower than the power supply voltage V0. The reason why the voltage Vg which satisfies the expression (1) is applied to a word line will be described later with reference to FIG. 2.

The clamp transistors $T_{FAIT}$ are provided to prevent the potential on the bit lines BL0 to BLn from overly rising. The clamp transistors $T_{FAIT}$ may be considered to be always in the on-state.

The memory cell array MCA further includes reference memory cells DMC0 and DMC1. The reference memory cells DMC0 have the same configuration as that of the information memory cells MC, and they are arranged in the column direction. The reference memory cells DMC0 are provided so as to be associated respectively with the word lines WL0 to WLm. Gates of the reference memory cells DMC0 are connected respectively to the word lines WL0 to WLm. Drains of the reference memory cells DMC0 are connected in common to the reference bit line DBL0. In order to prevent the retention, "1" is previously stored in the reference memory cells DMC0 as digital data of a single kind. Reference potential is a potential of reference data used to discriminate data in the memory cells MC.

Since the reference memory cells DMC1 have no relations to the operation of the semiconductor storage device 100, the reference memory cells DMC1 may not be present. Alternately, although the reference memory cells DMC1 are disconnected from the reference bit line DBL1 in FIG. 1, the reference memory cells DMC1 may be disconnected from ground.

Selection transistors $T_{DBS0}$ and $T_{DBS1}$ are connected between the reference bit lines DBL0 and DBL1 and the sense amplifiers SA, respectively. When reading out data, both the selection transistors $T_{DBS0}$ and $T_{DBS1}$ are turned on. As a result, the two reference bit lines DBL0 and DBL1 are connected to second inputs of the sense amplifiers. For example, if the bit line WL1 is selected, a reference memory cell DMCS is selected. In this case, the reference memory cell DMCS is electrically connected to the second inputs of the sense amplifiers SA. In addition, load current transistors $T_{DCL0}$ and $T_{DCL1}$ are turned on, and consequently two power supplies V0 are connected in parallel to the reference memory cell DMCS.

As described above, the drive voltage Vg applied to the word lines satisfies the expression (1). Since the reference memory cells DMC0 store data "1," the reference memory cells DMC0 turn on. As a result, the potential on the reference bit line DBL0 attempts to become V1 lower than the power supply voltage V0. On the other hand, in the present embodiment, the reference memory cells DMC1 are not connected to the reference bit line DBL1. As a result, the potential on the reference bit line DBL1 attempts to become V0 which is equal to the power supply voltage. However, the reference bit lines DBL0 and DBL1 are short-circuited to each other. Therefore, an average potential of the reference bit line DBL0 and the reference bit line DBL1 is carried by the reference bit line DBL0 and the reference bit line DBL1. In other words, a reference potential Vref represented by the following expression (2) is carried to the second input of the sense amplifier SA1.

$$Vref = \frac{1}{2}(V0+V1) \quad (2)$$

Figure 2:
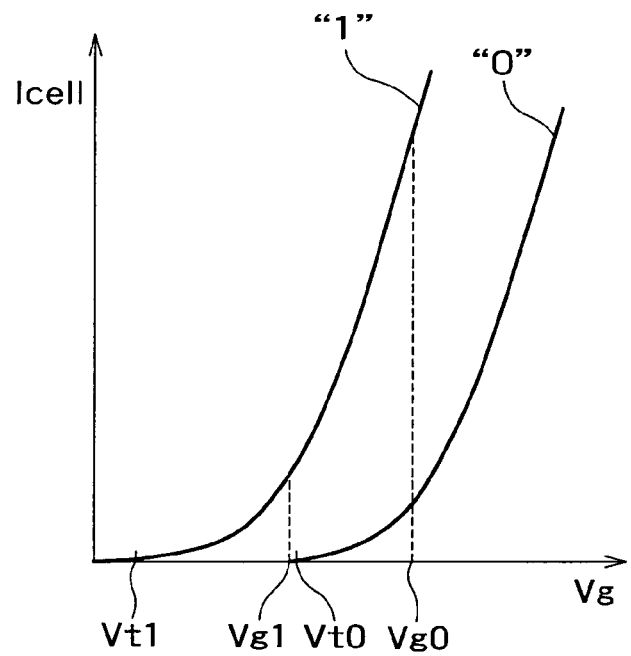
FIG. 2 is a graph showing relations between the drive potential Vg applied to a word line selected at the time of readout and a cell current Icell which flows through the memory cell MCS.
Figure 3:
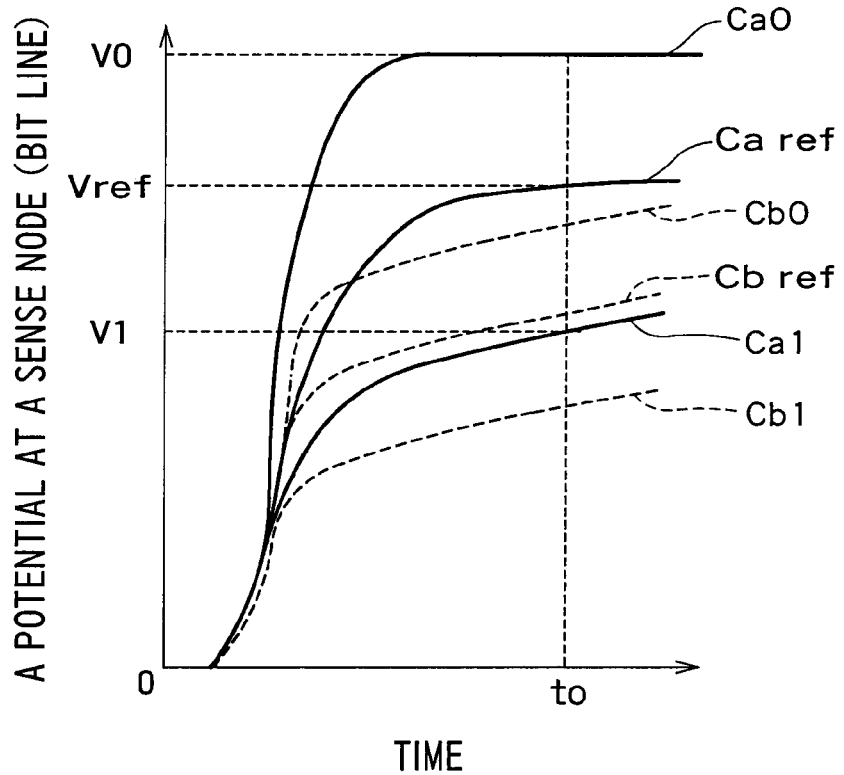
FIG. 3 is a graph showing a potential at a bit line that transmits data "1," a potential at a bit line that transmits data "0," and a potential at a bit line that transmits the reference potential Vref.

FIG. 2 is a graph showing relations between the drive potential Vg applied to a word line selected at the time of readout and a cell current Icell which flows through the memory cell MCS. FIG. 3 is a graph showing a potential at a sense node (bit line) that transmits data "1," a potential at a sense node (bit line) that transmits data "0," and a potential at a sense node (bit line) that transmits the reference potential Vref.

As shown in FIG. 2, a drive potential Vg0 is applied to the word line in the conventional technique. The drive potential Vg0 is a voltage that turns on both memory cells having data "1" and memory cells having data "0" in the linear state. A cell current Icell in a memory cell having data "1" is greater than that in a memory cell having data "0." Because of the difference in the cell current Icell, a potential difference occurs between a bit line that transmits data "1" and a bit line that transmits data "0" as shown in FIG. 3.

Broken line curves Cb0, Cb1 and Cbref are curves corresponding to the conventional data "0," data "1" and reference potential. A point in time to is a point in time at which a sense amplifier SA detects data at the time of readout. Referring to the broken line curves Cb0 and Cb1, a potential difference occurs between a bit line that transmits data "1" and a bit line that transmits data "0." Referring to the broken line curve Cbref, a middle potential between the potential on a bit line carrying data "1" and the potential on a bit line carrying data "0" becomes the reference potential.

On the other hand, in the present embodiment, a drive potential Vg1 is applied to a word line as shown in FIG. 2. The drive potential Vg1 is a voltage that turns on an information memory cell having data "1" stored therein while maintaining the information memory cell MCS having data "0" stored therein in the cut off state. At this time, the current Icell flows through an information memory cell having data "1" stored therein, but the current Icell does not flow through an information memory cell having data "0" stored therein. As a result, a potential difference occurs between a bit line carrying data "1" and a bit line carrying data "0."

Solid line curves Ca0, Ca1 and Caref shown in FIG. 3 are curves corresponding to data "0," data "1" and the reference potential in the present embodiment. As represented by the broken line Cb1 and the solid line curve Ca1, the potential V1 at a sense node (bit line) that transmits data "1" in the present embodiment becomes higher than a potential at a sense node (bit line) that transmits data "1" in the conventional technique. Since information memory cells having data "0" stored therein are cut off, however, the potential on a bit line that transmits data "0" is V0 and constant, and it becomes higher than that in the conventional technique. As a result, the width of the potential difference between data "1" and "0" is maintained, or the potential difference can be widened.

It will be appreciated by referring to the solid line Caref that a middle potential between a potential on a bit line carrying data line "1" and a potential on a bit line carrying data line "0" becomes the reference potential Vref at the point in time t0.

The reason why the drive voltage Vg on a word line at the time of readout is restrained as represented by the expression (1) will now be described. If the drive voltage Vg1 for a word line is higher than the potential Vt0 in the present embodiment, an information memory cell MC having data "0" stored therein turns on. Therefore, the potential on a bit line carrying data "0" falls from V0. This means that the potential at an information memory cell MCS having data "0" stored therein is biased to the reference potential Vref side. In other words, the reference potential Vref becomes different from the middle potential between data "1" and data "0." There is a possibility that this makes it difficult to discriminate between data "0" and data "1." If the drive voltage Vg1 is lower than the potential Vt1, the reference memory cell DMCS having data "1" stored therein does not turn on and consequently the relation V1=V0 is satisfied and the reference potential Vref becomes V0 according to the expression (2). This makes it impossible to discriminate between data "0" and data "1." For the reason heretofore described, Vg needs to satisfy the expression (2).

It might be considered that a reference memory cell DMC1 may be connected to the reference bit line DBL1 if the drive voltage Vg on a word line at the time of readout is lower than the threshold voltage Vt0 of a memory cell having data "0" stored therein. If the reference memory cell DMC1 is connected to the reference bit line DBL1, however, data in the reference memory cell DMC1 is changed from "0" to "1" by the retention. Even if the drive voltage Vg on a word line is lower than the voltage Vt0, therefore, the reference memory cells DMC1 need to be disconnected from the reference bit line DBL1.

In the present embodiment, the pair of the reference bit lines DBL0 and DBL1 may be provided every bit line, or may be provided every a plurality of bit lines. The pair of the reference bit lines DBL0 and DBL1 may be provided every memory cell array.

According to the present embodiment, the reference potential Vref is generated by using only a reference memory cell having data "1" stored therein. Therefore, refreshing for the reference memory cells becomes unnecessary and the power dissipation is reduced. Since the reference cells having data "0" stored therein are not used, the variation in the reference potential can be made smaller than that in the conventional technique.

Second Embodiment

Figure 4:
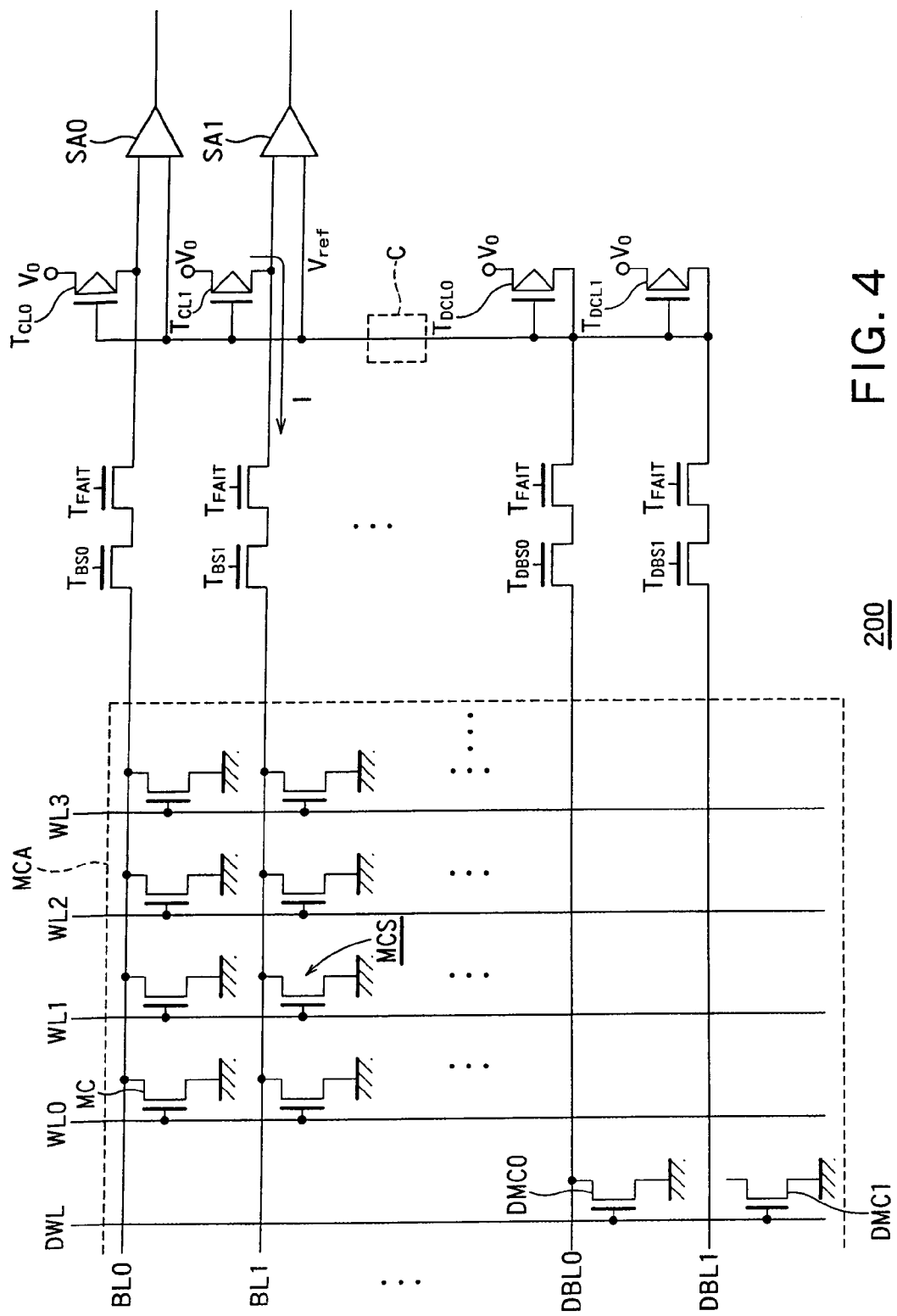
FIG. 4 is a partial circuit diagram of a semiconductor storage device 200 according to a second embodiment of the present invention.

FIG. 4 is a partial circuit diagram of a semiconductor storage device 200 according to a second embodiment of the present invention. In the second embodiment, one reference memory cell DMC0 is provided in the memory cell array MCA. The reference memory cell DMC0 is connected to one reference bit line DBL0. Furthermore, a reference word line DWL is provided for the reference memory cell DMC0. Other components in the second embodiment may be the same as those in the first embodiment.

In the second embodiment, one of word lines WL0 to WLm and one of bit lines BL0 to BLn are selected at the time of readout, and in addition a reference word line DWL and a reference bit line DBL0 are also selected. For example, when reading out data stored in the memory cell MCS, the word line WL1 is driven and the selection transistor $T_{BS1}$ is turned on. As a result, the memory cell MCS is connected to the first input of the sense amplifier SA1. The voltage according to the expression (1) is applied to the word line WL1. In addition, the load current transistor $T_{CL1}$ is turned on, and consequently a current I flows from the power supply V0 to the memory cell MCS. As a result, the potential V0 or V1 depending upon data "0" or "1" in the memory cell MCS is transmitted to the first input of the sense amplifier SA1.

Furthermore, the reference word line DWL is driven, and the selection transistors $T_{DBS0}$ and $T_{DBS1}$ are turned on. As a result, the reference memory cell DMC0 is connected to the second input of the sense amplifier SA1. The voltage Vg according to the equation 1 is applied to the reference line DW0 as well. By turning on the load current transistors $T_{DCL0}$ and $T_{DCL1}$ at this time, two power supplies V0 are connected in parallel with the reference memory cell DMC0.

In the present embodiment, the pair of the reference bit lines DBL0 and DBL1 may be provided every bit line, or may be provided every a plurality of bit lines. The pair of the reference bit lines DBL0 and DBL1 may be provided every memory cell array.

Since the reference memory cell DMC1 has no relation to the operation of the semiconductor storage device 200, the reference memory cell DMC1 may not be present. In addition, the reference memory cell DMC1 is disconnected from the reference bit line DBL1 in FIG. 4. Instead, the reference memory cell DMC1 may be disconnected from the ground.

Other operations in the second embodiment are similar to those in the first embodiment. Therefore, the second embodiment brings about effects similar to those brought about by the first embodiment. In addition, since only one reference memory cell DMC1 is provided for each reference bit line DBL0, the area of the memory cell region can be made small.

Third Embodiment

Figure 5:
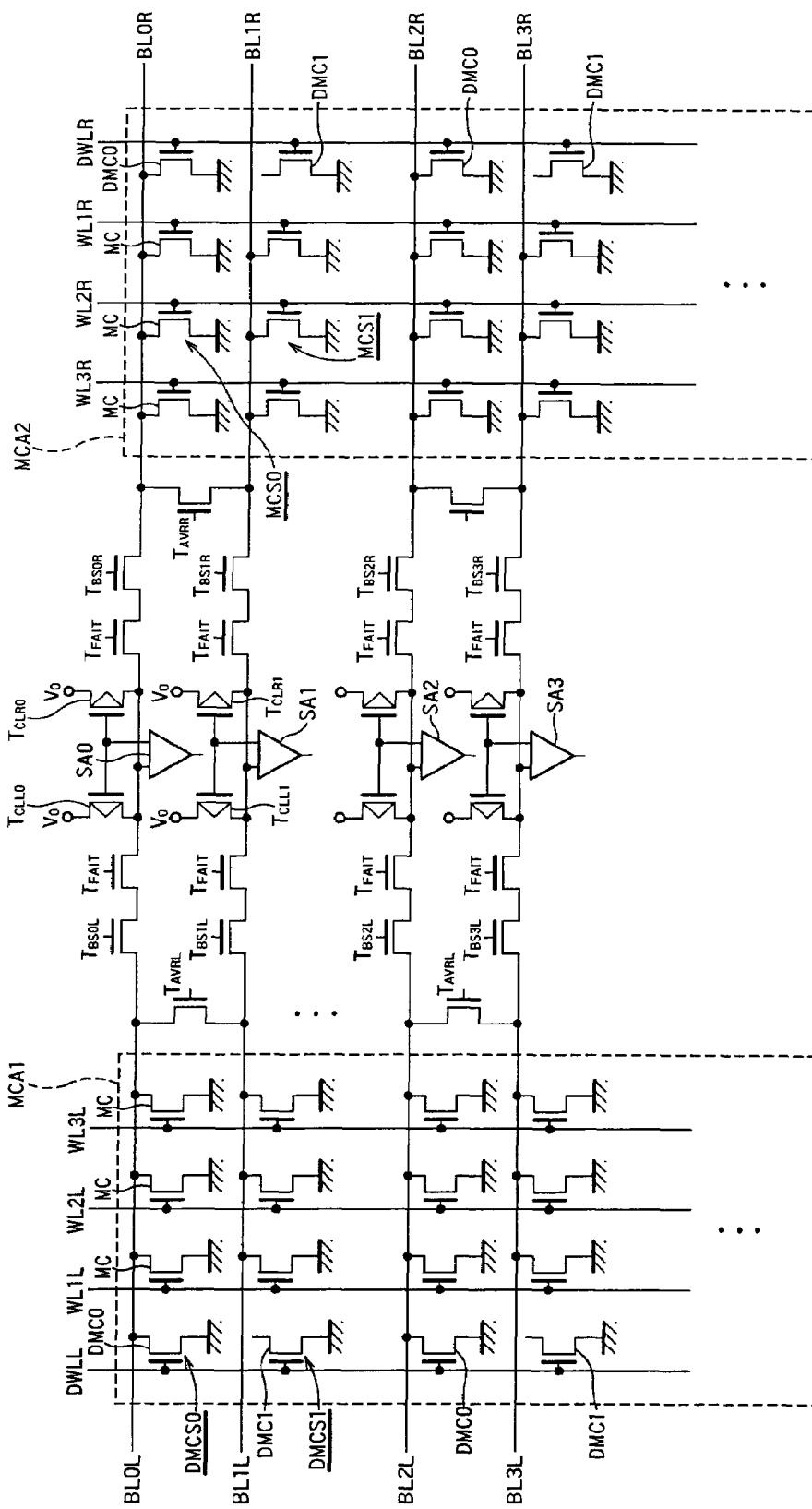
FIG. 5 is a partial circuit diagram of a semiconductor storage device 300 according to a third embodiment of the present invention.

FIG. 5 is a partial circuit diagram of a semiconductor storage device 300 according to a third embodiment of the present invention. The semiconductor storage device 300 has an open-bit-line configuration. Therefore, sense amplifiers SA0 to SAn are disposed between two memory cell arrays MCA1 and MCA2. The sense amplifiers SA0 to SAn are connected to bit lines BL0L to BLnL and BL0R to BLnR respectively included in the memory cell arrays MCA1 and MCA2. The memory cell arrays MCA1 and MCA2 include reference word lines DWLL and DWLR, respectively. The reference memory cells DMC0 and DMC1 are arranged alternately in the row direction. Gates of the reference memory cells DMC0 and DMC1 are connected to a reference word line DWLL or DWLR. The reference memory cells DMC0 are connected to bit lines. However, the reference memory cells DMC1 are not connected to bit lines. The reference memory cells DMC0 have data "1" stored therein. Two adjacent bit lines constitute a pair. Averaging transistors $T_{AVRL}$ and $T_{AVRR}$ are connected between bit lines of the pairs.

When reading out data from a memory cell MC, the sense amplifiers SA0 to SAn receive information data from bit lines included in one of the memory cell arrays MCA1 and MCA2 and receive reference data from bit line included in the other of the memory cell arrays MCA1 and MCA2. The sense amplifiers SA0 to SAn discriminate the information data on the basis of the reference data. Since the third embodiment has the open bit line configuration, reference data is generated by two adjacent bit lines in the same memory cell array.

For example, when discriminating data stored in the memory cells MCS0 and MCS1, selection transistors $T_{BS0R}$ and $T_{BS1R}$ are turned on and consequently memory cells MCS0 and MCS1 are connected to first inputs of the sense amplifiers SA0 and SA1, respectively. Subsequently, a word line WL2R is driven and load current transistors $T_{CLR0}$ and $T_{CLR1}$ are turned on. As a result, data stored in the memory cells MCS0 and MCS1 are transmitted to the sense amplifiers SA0 and SA1, respectively. The voltage applied to the word line WL2R at this time is the voltage Vg satisfying the expression (1). By the way, averaging transistors $T_{AVRR}$ are in the off-state.

On the other hand, in the memory cell array MCA1, reference data is generated by using data stored in a reference memory cell DMCS0. First, the averaging transistors $T_{AVRL}$ are turned on. As a result, the reference bit lines BL0L and BL1L are short-circuited to each other. Selection transistors $T_{BS0L}$ and $T_{BS1L}$ are turned on. Therefore, the reference memory cell DMCS0 is connected to second inputs of the sense amplifiers SA0 and SA1. In addition, the reference word line DWLL is driven, and load current transistors $T_{CLL0}$ and $T_{CLL1}$ are turned on. The voltage applied to the reference word line DWLL is the potential Vg satisfying the expression (1). Since a reference memory cell DMCS1 is not connected to the bit line BL1L, two power supplies V0 are connected to the reference memory cell DMCS0 in parallel. Therefore, the reference potential Vref according to the expression (2) is transmitted to the sense amplifiers SA0 and SA1. Thereafter, the sense amplifiers SA0 and SA1 respectively detect data stored in the memory cells MCS0 and MCS1 on the basis of the reference potential Vref.

Since the reference memory cell DMC1 has no relation to the operation of the semiconductor storage device 300, the reference memory cell DMC1 may not be present. In addition, the reference memory cell DMC1 is disconnected from the reference bit line DBL1 in FIG. 5. Instead, the reference memory cell DMC1 may be disconnected from the ground.

Although the third embodiment has the open bit line configuration, effects similar to those in the first embodiment can be obtained.

Fourth Embodiment

Figure 6:
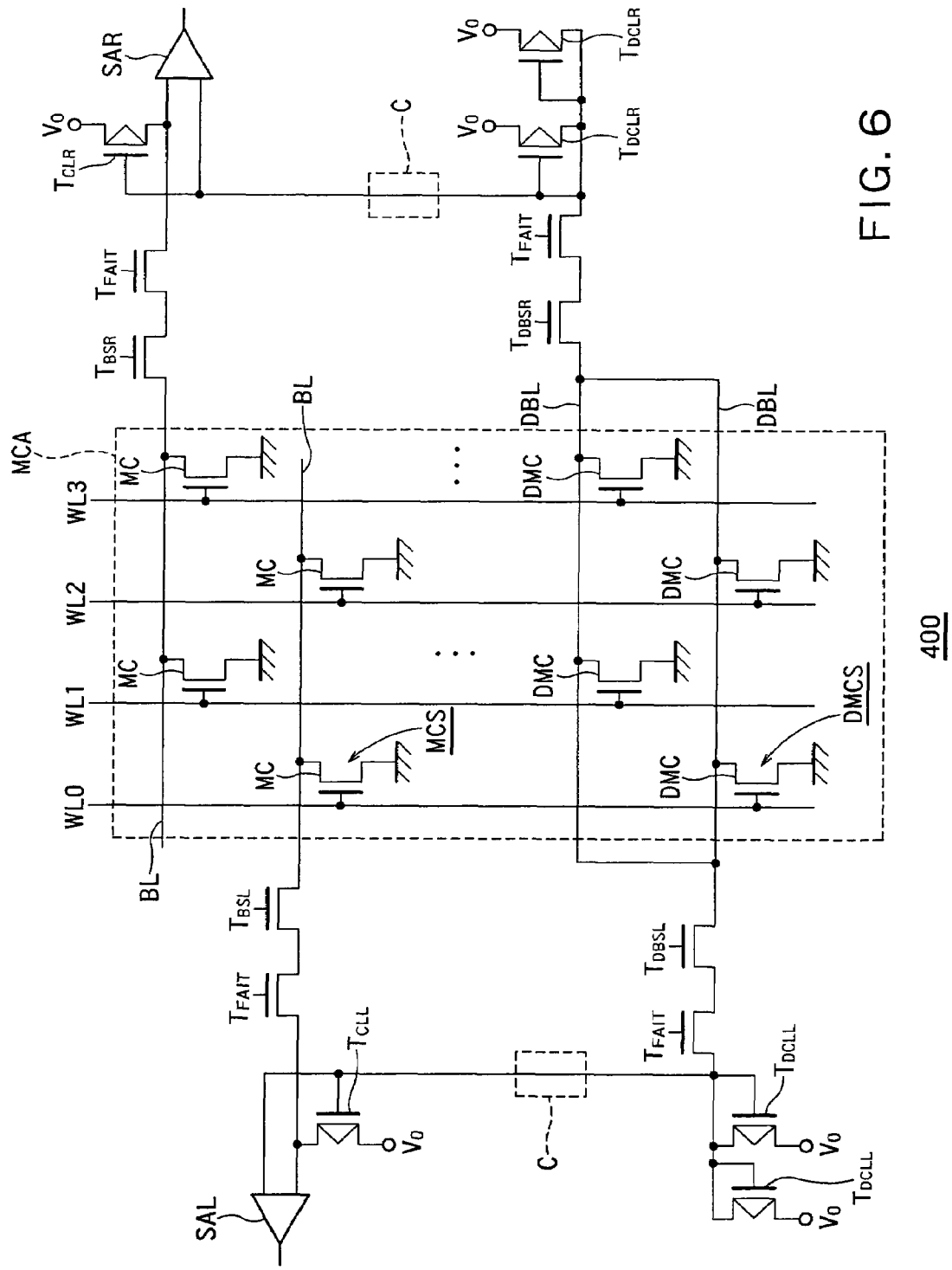
FIG. 6 is a partial circuit diagram showing a semiconductor storage device 400 according to a fourth embodiment of the present invention.

FIG. 6 is a partial circuit diagram showing a semiconductor storage device 400 according to a fourth embodiment of the present invention. In a memory cell array MCA in the semiconductor storage device 400, information memory cells MC and reference memory cells DMC are disposed so as to be respectively displaced by half pitch in adjacent rows and adjacent columns.

A bit line BL is connected to a first input of a sense amplifier SAL or SAR via a selection transistor $T_{BSL}$ or $T_{BSR}$, and a clamp transistor $T_{FAIT}$. Furthermore, the bit line BL is connected to the power supply voltage V0 via the selection transistor $T_{BSL}$ or $T_{BSR}$, the clamp transistor $T_{FAIT}$, and a load current transistor $T_{CLL}$ or $T_{CLR}$.

All of the reference memory cells DMC have data "1" stored therein. The reference memory cells DMC are arranged in two columns, and connected to one or the other of two reference bit lines DBL. The two reference bit lines DBL are connected to each other, and short-circuited to each other. Each reference bit line DBL is connected to a second input of the sense amplifier SAL or SAR via the selection transistor $T_{DBSL}$ or $T_{DBSR}$, and the clamp transistor $T_{FAIT}$. Furthermore, each reference bit line DBL is connected in parallel with two power supply voltages V0 via the selection transistor $T_{DBSL}$ or $T_{DBSR}$, the clamp transistor $T_{FAIT}$, and a load current transistor $T_{DCLL}$ or $T_{DCLR}$. In the present embodiment, reference memory cells having data "0" stored therein are not formed.

When reading out data from a memory cell MC, the sense amplifier SAL or SAR receives information data from the bit line BL, and receives reference data from the reference bit line DBL. The sense amplifier SAL or SAR discriminates a digital value of the information data on the basis of the reference data.

For example, when the sense amplifier SAL discriminates information data stored in an information memory cell MCS, the selection transistor $T_{BSL}$ and the clamp transistor $T_{CLL}$ are turned on. In addition, the voltage Vg according to the expression (1) is applied to the word line WL0. As a result, the information memory cell MCS is connected to the first input of the sense amplifier SAL, and information data stored in the information memory cell MCS is transmitted to the sense amplifier SAL. It is supposed that a current that flows through the information memory cell MCS at this time is I.

On the other hand, two power supply voltages V0 are connected to one reference memory cell DMCS by turning on the selection transistor $T_{DBSL}$ and the clamp transistor $T_{DCLL}$. In addition, a reference memory cell DMCS included in the reference memory cells DMC is connected to the second input of the sense amplifier SAL by driving the word line WL0. The voltage applied to the word line WL0 is the potential Vg satisfying the expression (1). As a result, the sense amplifier SAL can detect data stored in the memory cell MC on the basis of the reference potential Vref.

The fourth embodiment has a configuration in which the information memory cells MC and the reference memory cells DMC are displaced alternately by half pitch. However, effects similar to those in the first embodiment can be obtained. Furthermore, in the fourth embodiment, reference memory cells storing data "0" are not formed, resulting in a reduced cell area.

Fifth Embodiment

Figure 7:
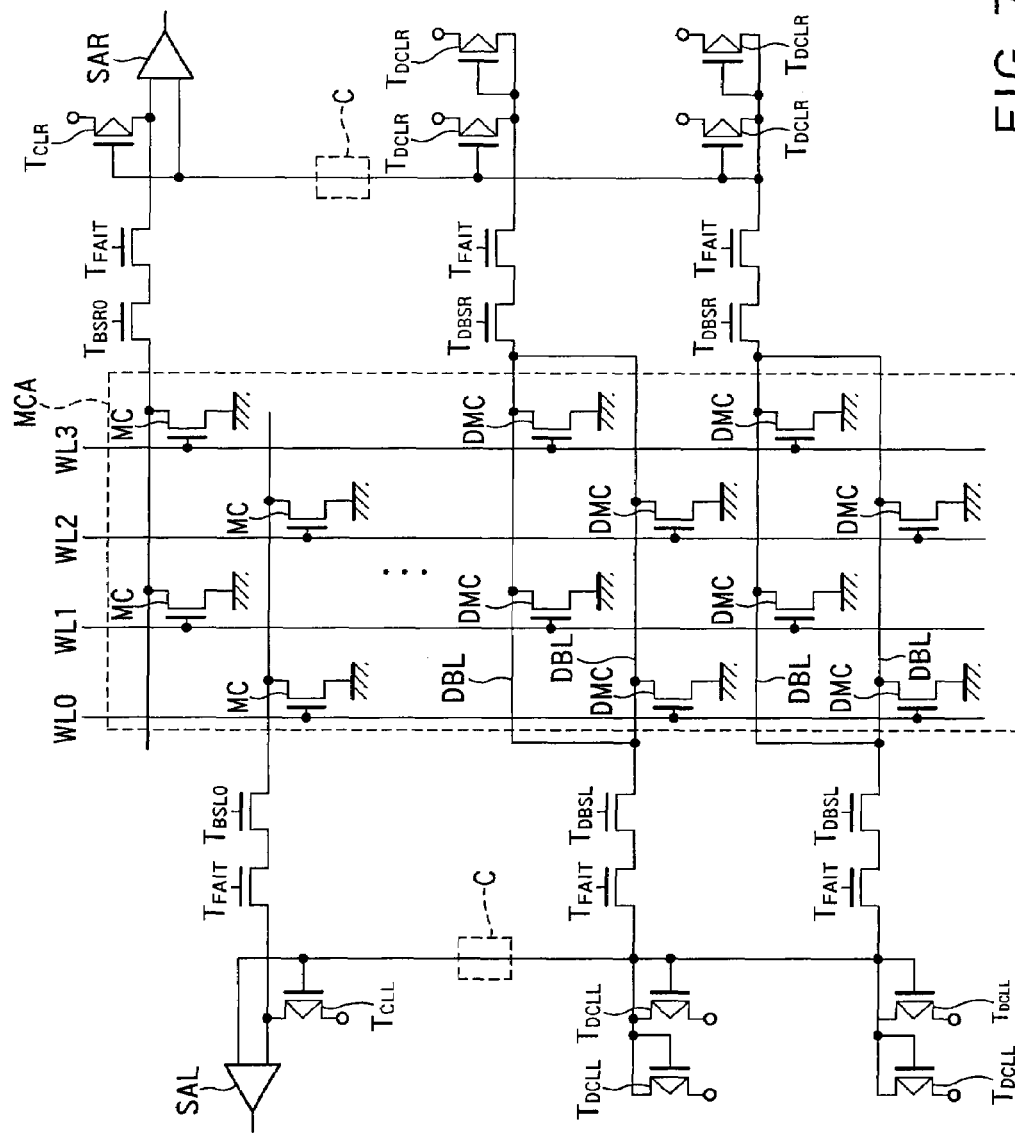
FIG. 7 is a partial circuit diagram of a semiconductor storage device 500 according to a fifth embodiment of the present invention.

FIG. 7 is a partial circuit diagram of a semiconductor storage device 500 according to a fifth embodiment of the present invention. The fifth embodiment differs from the fourth embodiment in that reference memory cells DMC are arranged in four columns respectively connected to four reference bit lines DBL. Two reference bit lines DBL constitute a pair and are connected to each other. Although the fourth embodiment has one pair of reference bit lines DBL, the fifth embodiment has two pairs of reference bit lines DBL. All of the reference memory cells DMC store data "1."

Operation of the fifth embodiment is similar to that of the fifth embodiment. In the fifth embodiment, however, the two reference bit line pairs execute the same operation. As a result, two reference memory cells DMC are connected to the sense amplifier SAL or SAR to generate the reference data. In the fifth embodiment, therefore, a stable reference potential can be supplied to the sense amplifier SAL or SAR. The fifth embodiment can bring about effects similar to those in the fourth embodiment.

Sixth Embodiment

Figure 8:
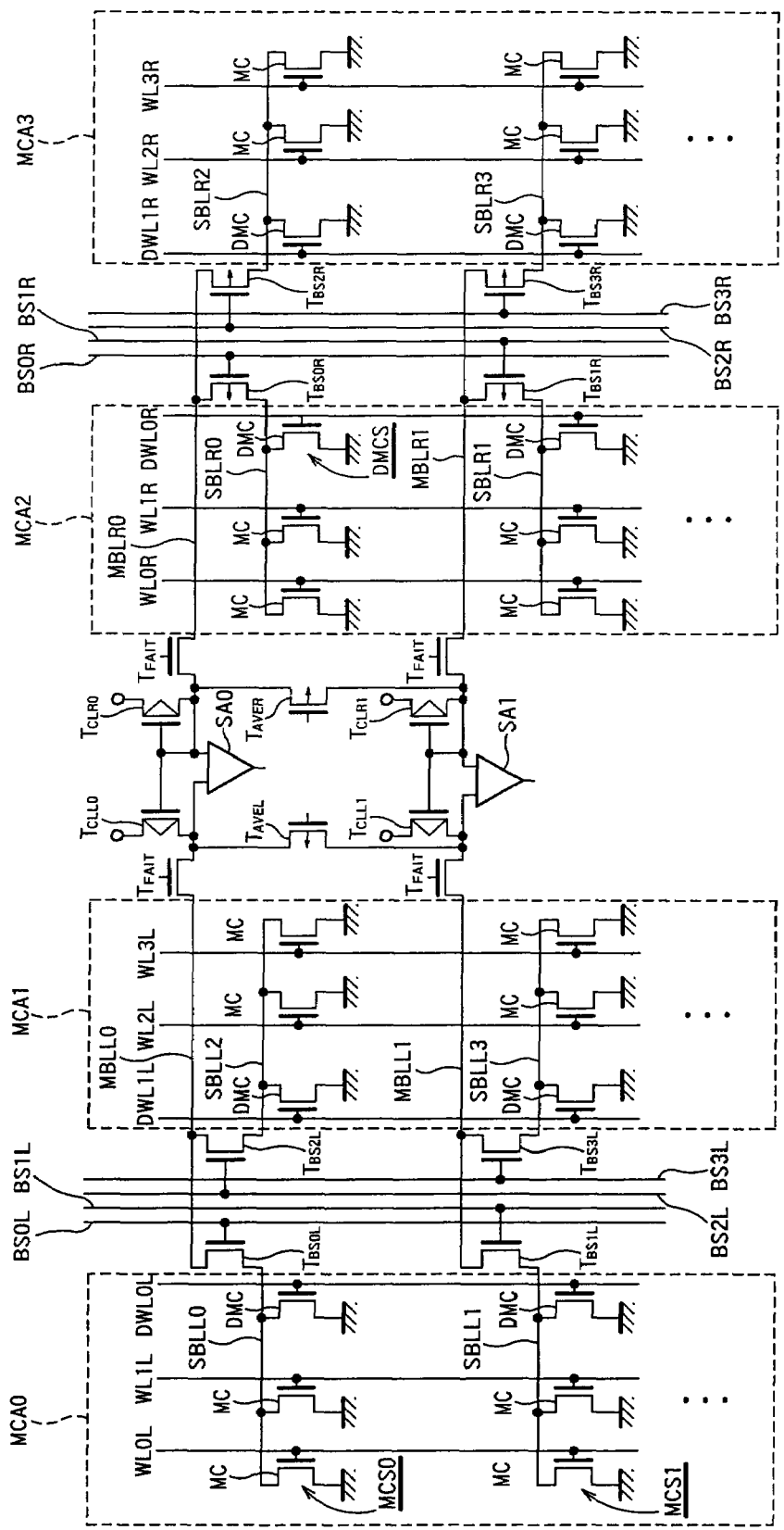
FIG. 8 is a partial circuit diagram of a semiconductor storage device 600 according to a sixth embodiment of the present invention.

FIG. 8 is a partial circuit diagram of a semiconductor storage device 600 according to a sixth embodiment of the present invention. The semiconductor storage device 600 has an open-bit-line configuration. Sense amplifiers SA0 and SA1 are connected to bit lines of four memory cell arrays MCA0 to MCA3. In the present embodiment, sub bit lines SBLL0 and SBLL1 are provided in a memory cell array MCA0, and sub bit lines SBLL2 and SBLL3 are provided in a memory cell array MCA1. Sub bit lines SBLR0 and SBLR1 are provided in a memory cell array MCA2, and sub bit lines SBLR2 and SBLR3 are provided in a memory cell array MCA3.

The sub bit lines SBLL0 and SBLL2 are connected to a main bit line MBLL0 via bit line selection transistors $T_{BS0L}$ and $T_{BS2L}$, respectively. The sub bit lines SBLL1 and SBLL3 are connected to a main bit line MBLL1 via bit line selection transistors $T_{BS1L}$ and $T_{BS3L}$, respectively. The sub bit lines SBLR0 and SBLR2 are connected to a main bit line MBLR0 via bit line selection transistors $T_{BS0R}$ and $T_{BS2R}$, respectively. The sub bit lines SBLR1 and SBLR3 are connected to a main bit line MBLR1 via bit line selection transistors $T_{BS1R}$ and $T_{BS3R}$, respectively.

The main bit lines MBLL0 and MBLR0 are connected to the sense amplifier SA0. The main bit lines MBLL1 and MBLR1 are connected to the sense amplifier SA1.

When the sense amplifiers SA0 and SA1 detect data, the sense amplifiers SA0 and SA1 obtain information data from one of the main bit lines MBLL0 and MBLR0, and obtain reference data from the other of the main bit lines MBLL0 and MBLR0. The sense amplifiers SA0 and SA1 discriminate the information data on the basis of the reference data. For example, when the sense amplifiers SA0 and SA1 read out data stored in two information memory cells MCS0 and MCS1 in the memory cell array MCA0, bit line selection signals BS0L and BS1L are driven to turn on bit line selection transistors $T_{BS0L}$ and $T_{BS1L}$, respectively. As a result, the sub bit lines SBLL0 and SBLL1 are connected to the main bit lines MBLL0 and MBLL1, respectively. In addition, the voltage Vg according to the expression (1) is applied to a word line WL0L, and load current transistors TCLL0 and TCLL1 are turned on. As a result, data stored in the information memory cells MCS0 and MCS1 are transmitted to the sense amplifiers SA0 and SA1, respectively. By the way, an averaging transistor $T_{AVEL}$ maintains its off-state.

On the other hand, it is supposed that a reference memory cell DMCS in the memory cell array MCA2 is used to generate reference data. First, an averaging transistor $T_{AVER}$ is turned on. As a result, the main bit lines MBLR0 and MBLR1 are connected to each other. Bit line selection signals BS0R and BS3R are driven to turn on the bit line selection transistors $T_{BS0R}$ and $T_{BS3R}$. As a result, the sub bit lines SBLR0 and SBLR3 are connected to each other via the main bit lines MBLR0 and MBLR1 and the averaging transistor $T_{AVER}$.

Furthermore, a reference memory cell DMCS is electrically connected to second inputs of the sense amplifiers SA0 and SA1. In addition, load current transistors $T_{CLR0}$ and $T_{CLR1}$ are turned on to connect two power supply voltages V0 to the reference memory cell DMCS in parallel. In addition, the voltage Vg according to the expression (1) is applied to a reference word line DWL0R. As a result, the reference potential Vref according to the expression (2) is transmitted to the sense amplifiers SA0 and SA1. Therefore, the sense amplifiers SA0 and SA1 can detect data stored in the information memory cells MCS0 and MCS1 on the basis of the reference potential Vref.

When reading out data stored in a memory cell MC in the memory cell array MCA1, bit line selection signals BS2L and BS3L should be driven. When reading out data stored in a memory cell MC in the MCA2 or MCA3, a reference memory cell DMC in the memory cell array MCA0 or MCA1 should be used.

In the sixth embodiment, two sub bit lines are connected to one main bit line. However, three or more sub bit lines may be connected to one main bit line. A seventh embodiment is an embodiment in which four sub bit lines are connected to one main bit line. The sixth embodiment can bring about effects similar to those in the first embodiment.

Seventh Embodiment

Figure 9:
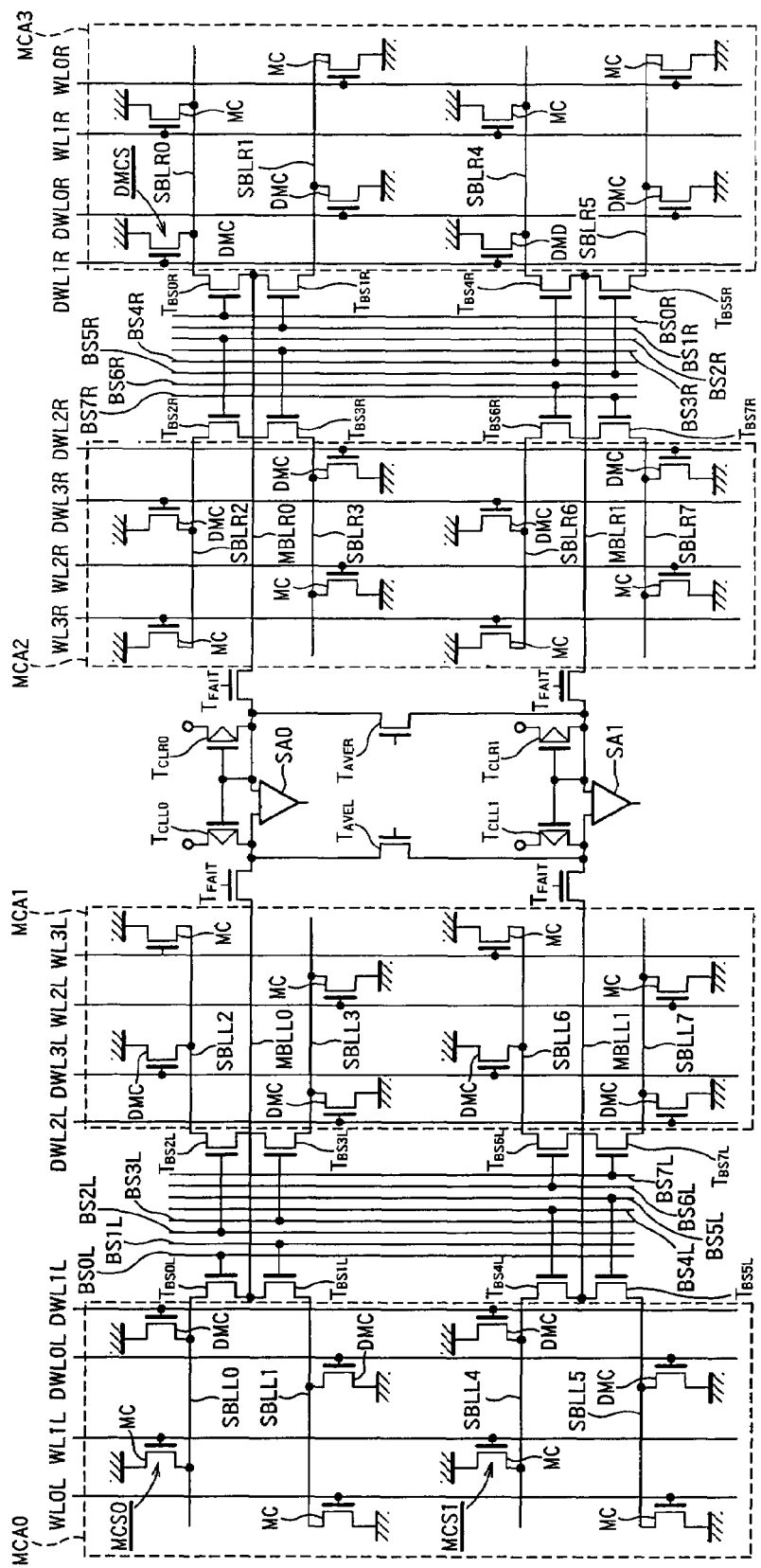
FIG. 9 is a partial circuit diagram showing a semiconductor storage device 700 according to a seventh embodiment of the present invention.

FIG. 9 is a partial circuit diagram showing a semiconductor storage device 700 according to a seventh embodiment of the present invention. The seventh embodiment is similar to the sixth embodiment in that a plurality of sub bit lines are provided for a main bit line. However, the seventh embodiment differs from the sixth embodiment in that four sub bit lines are provided for one main bit line. Furthermore, in the seventh embodiment, memory cells MC are arranged so as to be displaced by half pitch in adjacent rows and adjacent columns.

Sub bit lines SBLL0 to SBLL3 are connected to a main bit line MBLL0 via bit line selection transistors $T_{BS0L}$ to $T_{BS3L}$, respectively. Sub bit lines SBLL4 to SBLL7 are connected to a main bit line MBLL1 via bit line selection transistors $T_{BS4L}$ to $T_{BS7L}$, respectively. Sub bit lines SBLR0 to SBLR3 are connected to a main bit line MBLR0 via bit line selection transistors $T_{BS0R}$ to $T_{BS3R}$, respectively. Sub bit lines SBLR4 to SBLR7 are connected to a main bit line MBLR1 via bit line selection transistors $T_{BS4R}$ to $T_{BS7R}$, respectively.

When the sense the sense amplifiers SA0 and SA1 detect data, the sense amplifiers SA0 and SA1 obtain information data from one of the main bit lines MBLL0 and MBLR0, and obtain reference data from the other of the main bit lines MBLL0 and MBLR0. The sense amplifiers SA0 and SA1 discriminate the information data on the basis of the reference data. For example, when the sense amplifiers SA0 and SA1 read out data stored in information memory cells MCS0 and MCS1 in the memory cell array MCA0, bit line selection signals BS0L and BS4L are driven to turn on bit line selection transistors $T_{BS0L}$ and $T_{BS4L}$, respectively. As a result, the sub bit lines SBLL0 and SBLL4 are connected to the main bit lines MBLL0 and MBLL1, respectively. Accordingly, the information memory cells MCS0 and MCS1 are electrically connected to first inputs of the sense amplifiers SA0 and SA1, respectively. Load current transistors $T_{CLL0}$ and $T_{CLL1}$ are turned on, and the voltage Vg according to the expression (1) is applied to a word line WL1L. As a result, a current I flows through the information memory cells MCS0 and MCS1, and data stored in the information memory cells MCS0 and MCS1 are transmitted to the sense amplifiers SA0 and SA1, respectively. By the way, an averaging transistor $T_{AVEL}$ maintains its off-state.

On the other hand, it is supposed that a reference memory cell DMCS in the memory cell array MCA2 is used to generate reference data. First, an averaging transistor $T_{AVER}$ is turned on. As a result, the main bit lines MBLR0 and MBLR1 are connected to each other. Bit line selection signals BS0R and BS5R are driven to turn on the bit line selection transistors $T_{BS0R}$ and $T_{BS5R}$. As a result, the sub bit lines SBLR0 and SBLR5 are connected to each other via the main bit lines MBLR0 and MBLR1 and the averaging transistor $T_{AVER}$. Furthermore, a reference memory cell DMCS is electrically connected to second inputs of the sense amplifiers SA0 and SA1. Load current transistors $T_{CLR0}$ and $T_{CLR1}$ are turned on to connect two power supply voltages V0 to the reference memory cell DMCS in parallel. In addition, the voltage Vg according to the expression (1) is applied to a reference word line DWL1R. As a result, the reference potential Vref according to the expression (2) is transmitted to the sense amplifiers SA0 and SA1. Therefore, the sense amplifiers SA0 and SA1 can detect data stored in the information memory cells MCS0 and MCS1 on the basis of the reference potential Vref.

When reading out data stored in a memory cell MC connected to a word line WL0L, bit line selection signals BS1L and BS5L should be driven. Also, when reading out data stored in a memory cell MC in the memory cell array MCA1, bit line selection signals BS2L and BS6L or BS3L and BS7L should be driven. Further, when reading out data stored in a memory cell MC in the MCA2 or MCA3, a reference memory cell DMC in the memory cell array MCA0 or MCA1 should be used.

The seventh embodiment has a configuration in which the information memory cells and the reference memory cells DMC are alternately displaced by half pitch. However, the seventh embodiment can bring about effects similar to those in the sixth embodiment.

Figure 10:
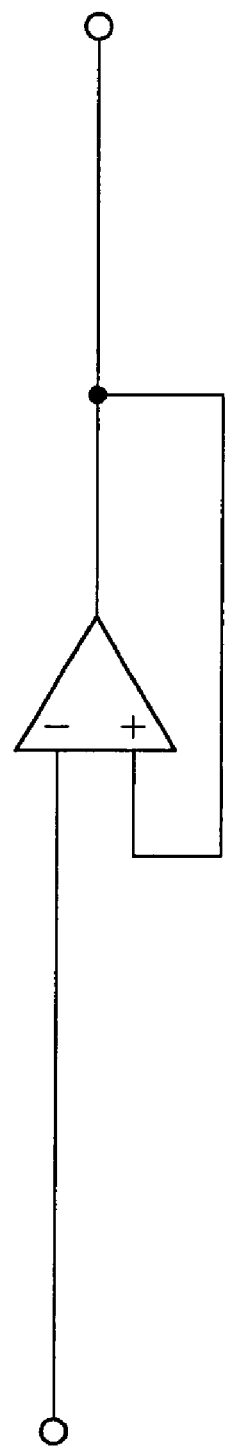
FIG. 10 is a diagram showing an example of a non-inverting amplifier circuit.

FIG. 10 is a diagram showing an example of a non-inverting amplifier circuit. If relatively long wiring is present between sense amplifiers and reference bit lines in the embodiments shown in FIGS. 1, 4, 6 and 7, there is a fear that the reference data Vref may be delayed. Therefore, the non-inverting amplifier circuit shown in FIG. 10 is connected in a broken line frame C shown in each of FIGS. 1, 4, 6 and 7. As a result, the wiring delay of the reference data Vref can be prevented.

In the embodiments heretofore described, the number of memory cells, the number of bit lines, and the number of word lines are not restricted. Furthermore, a reference bit line may be provided every information bit line, or may be provided every a plurality of information bit lines. The reference bit line may be provided every memory cell array.

In the embodiments described hereinbefore, the bit lines are arranged in a column direction of the memory cell array, and the word lines are arranged in a row direction of the memory cell array. However, the bit lines and the word lines are interchangeable each other. That is, the bit lines may be arranged in a row direction of the memory cell array, and the word lines may be arranged in a column direction of the memory cell array.

The invention claimed is:
1. A semiconductor storage device comprising:
   information memory cells;
   a plurality of memory cell arrays including the information memory cells arranged in a matrix;
   information word lines connected to the information memory cells;

bit lines connected to the information memory cells;

reference memory cells, each of which is provided for a pair of bit lines and is connected to one bit line of the pair, all reference memory cells storing a same digital data;

average transistors connected between the pair of the bit lines, the average transistors connecting the pair of the bit lines with each other when a reference data is generated, the reference data having a middle potential between a potential of a bit line transmitting a first data and a potential of a bit line transmitting a second data; and sense amplifiers respectively connected to two bit lines included respectively in two memory cell arrays, one of the sense amplifiers being connected to one of the information memory cells included in one of the two memory cell arrays via one of the two bit lines and being connected to the reference memory cell included in the other memory cell array via the other bit line when a data is read out from one of the information memory cells, the sense amplifiers using the reference data.

2. The semiconductor storage device according to claim 1, wherein when a data is read out from one of the information memory cells, a voltage is applied to one of the information word lines, the voltage being at least a threshold voltage of the information memory cell having the first data stored therein and being at most a threshold voltage of the information memory cell having the second data stored therein.

3. The semiconductor storage device according to claim 1, wherein when a data is read out from one of the information memory cells, a voltage is applied to one of the information word lines, so that the information memory cell storing the first data becomes in a conductive state and the information memory cell storing the second data remains in a nonconductive state.

* * * * *